United States Patent
Kim et al.

(10) Patent No.: US 9,207,301 B2
(45) Date of Patent: Dec. 8, 2015

(54) APPARATUS AND METHOD FOR COMPENSATING ARTIFACT IN HIGHER ORDER DIFFUSION MAGNETIC RESONANCE IMAGING (MRI)

(75) Inventors: Young Beom Kim, Suwon-si (KR); Byung Kwan Park, Seoul (KR); Seong Deok Lee, Seongnam-si (KR); Jae Mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 773 days.

(21) Appl. No.: 13/527,781

(22) Filed: Jun. 20, 2012

(65) Prior Publication Data
US 2013/0113481 A1    May 9, 2013

(30) Foreign Application Priority Data
Nov. 9, 2011    (KR) .................. 10-2011-0116236

(51) Int. Cl.
  *G01V 3/00* (2006.01)
  *G01R 33/563* (2006.01)
  *G01R 33/565* (2006.01)

(52) U.S. Cl.
  CPC .... *G01R 33/56341* (2013.01); *G01R 33/56518* (2013.01)

(58) Field of Classification Search
  CPC ............................................ G01R 33/56341
  USPC .................. 324/309, 307, 306, 300
  See application file for complete search history.

(56) References Cited

U.S. PATENT DOCUMENTS

| | | | |
|---|---|---|---|
| 5,833,609 A | 11/1998 | Dannels et al. | |
| 6,076,006 A | 6/2000 | Van Den Brink et al. | |
| 6,265,874 B1 | 7/2001 | McGee et al. | |
| 6,528,996 B1 | 3/2003 | Sato | |
| 6,614,226 B2 * | 9/2003 | Wedeen | 324/309 |
| 6,842,000 B2 | 1/2005 | Norris et al. | |
| 7,355,407 B1 * | 4/2008 | Zhang | 324/309 |
| 8,330,462 B2 * | 12/2012 | Poupon et al. | 324/309 |
| 9,097,778 B2 * | 8/2015 | Bito et al. | |
| 2005/0073303 A1 | 4/2005 | Harer et al. | |
| 2005/0218893 A1 * | 10/2005 | Kumai et al. | 324/309 |

(Continued)

FOREIGN PATENT DOCUMENTS

| | | |
|---|---|---|
| JP | 04-357934 A | 12/1992 |
| JP | 08-010239 A | 1/1996 |

(Continued)

OTHER PUBLICATIONS

King et al., q-Space Imaging of the Brain, published online Dec. 12, 2005; Magn Reson Med, 32(6): 707-713.*
DSI Stuido, Fiber Tracking, Sep. 28, 2011.*

*Primary Examiner* — Louis Arana
(74) *Attorney, Agent, or Firm* — NSIP Law

(57) ABSTRACT

An apparatus and method for compensating for an artifact of higher order diffusion Magnetic Resonance Imaging (MRI) are provided. The apparatus includes a construction unit configured to construct a diffusion q-space matrix, a correction unit configured to correct an image shift in a phase encoding direction in the constructed diffusion q-space matrix, a reconstruction processing unit configured to reconstruct a q-space of a Diffusion Spectrum Imaging (DSI) based on the corrected image shift, and a tracking processing unit to process a DSI fiber tracking using the reconstructed q-space of the DSI.

20 Claims, 6 Drawing Sheets

(56) References Cited

U.S. PATENT DOCUMENTS

2007/0182411 A1    8/2007   Bammer et al.
2008/0310696 A1   12/2008   Hwang
2014/0309517 A1* 10/2014   Tseng et al. .................. 600/410

FOREIGN PATENT DOCUMENTS

| | | |
|---|---|---|
| JP | 09-056695 A | 3/1997 |
| KR | 10-2004-0071643 A | 8/2004 |
| KR | 10-2010-0004321 A | 1/2010 |

* cited by examiner

FIG. 1 (RELATED ART)

DSI-203 scan protocol 100

| b-value | Gx | Gy | Gz |
|---|---|---|---|
| 0 | 0 | 0 | 0 |
| 307.692 | -1 | 0 | 0 |
| 307.692 | 0 | 1 | 0 |
| 307.692 | 0 | 0 | 1 |
| 307.692 | 0 | 0 | -1 |
| 307.692 | 0 | -1 | 0 |
| 307.692 | 1 | 0 | 0 |
| 615.385 | -0.707107 | 0.707107 | 0 |
| 615.385 | -0.707107 | 0 | 0.707107 |
| 615.385 | -0.707107 | 0 | -0.707107 |
| 615.385 | -0.707107 | -0.707107 | 0 |
| 615.385 | 0 | 0.707107 | 0.707107 |
| 615.385 | 0 | 0.707107 | -0.707107 |
| 615.385 | 0 | -0.707107 | 0.707107 |
| 615.385 | 0 | -0.707107 | -0.707107 |
| 615.385 | 0.707107 | 0.707107 | 0 |
| 615.385 | 0.707107 | 0 | 0.707107 |
| 615.385 | 0.707107 | 0 | -0.707107 |
| 615.385 | 0.707107 | -0.707107 | 0 |
| 923.077 | -0.57735 | 0.57735 | 0.57735 |
| 923.077 | -0.57735 | 0.57735 | -0.57735 |
| 923.077 | -0.57735 | -0.57735 | 0.57735 |
| 923.077 | -0.57735 | -0.57735 | -0.57735 |
| 923.077 | 0.57735 | 0.57735 | 0.57735 |
| 923.077 | 0.57735 | 0.57735 | -0.57735 |
| 923.077 | 0.57735 | -0.57735 | 0.57735 |
| 923.077 | 0.57735 | -0.57735 | -0.57735 |
| 1230.77 | -1 | 0 | 0 |
| 1230.77 | 0 | 1 | 0 |
| 1230.77 | 0 | 0 | 1 |
| 1230.77 | 0 | 0 | -1 |
| 1230.77 | 0 | -1 | 0 |
| 1230.77 | 1 | 0 | 0 |

FIG. 4

Modified scan protocol 400

| b-value | Gx | Gy | Gz |
|---|---|---|---|
| 0 | 0 | 0 | 0 |
| 307.692 | -1 | 0 | 0 |
| 307.692 | 0 | 1 | 0 |
| 307.692 | 0 | 0 | 1 |
| 307.692 | 0 | 0 | -1 |
| 307.692 | 0 | -1 | 0 |
| 307.692 | 1 | 0 | 0 |
| 0 | 0 | 0 | 0 |
| 615.385 | -0.707107 | 0.707107 | 0 |
| 615.385 | -0.707107 | 0 | 0.707107 |
| 615.385 | -0.707107 | 0 | -0.707107 |
| 615.385 | -0.707107 | -0.707107 | 0 |
| 615.385 | 0 | 0.707107 | 0.707107 |
| 615.385 | 0 | 0.707107 | -0.707107 |
| 0 | 0 | 0 | 0 |
| 615.385 | 0 | -0.707107 | 0.707107 |
| 615.385 | 0 | -0.707107 | -0.707107 |
| 615.385 | 0.707107 | 0.707107 | 0 |
| 615.385 | 0.707107 | 0 | 0.707107 |
| 615.385 | 0.707107 | 0 | -0.707107 |
| 615.385 | 0.707107 | -0.707107 | 0 |
| 0 | 0 | 0 | 0 |
| 923.077 | -0.57735 | 0.57735 | 0.57735 |
| 923.077 | -0.57735 | 0.57735 | -0.57735 |
| 923.077 | -0.57735 | -0.57735 | 0.57735 |
| 923.077 | -0.57735 | -0.57735 | -0.57735 |
| 923.077 | 0.57735 | 0.57735 | 0.57735 |
| 923.077 | 0.57735 | 0.57735 | -0.57735 |
| 923.077 | 0.57735 | -0.57735 | 0.57735 |
| 923.077 | 0.57735 | -0.57735 | -0.57735 |
| 0 | 0 | 0 | 0 |
| 1230.77 | -1 | 0 | 0 |
| 1230.77 | 0 | 1 | 0 |
| 1230.77 | 0 | 0 | 1 |
| 1230.77 | 0 | 0 | -1 |
| 1230.77 | 0 | -1 | 0 |
| 1230.77 | 1 | 0 | 0 |

~410

APPARATUS AND METHOD FOR COMPENSATING ARTIFACT IN HIGHER ORDER DIFFUSION MAGNETIC RESONANCE IMAGING (MRI)

CROSS-REFERENCE TO RELATED APPLICATION

This application claims the benefit under 35 U.S.C. §119 (a) of Korean Patent Application No. 10-2011-0116236, filed on Nov. 9, 2011, in the Korean Intellectual Property Office, the entire disclosure of which is incorporated herein by reference for all purposes.

BACKGROUND

1. Field

The following description relates to an apparatus and method for compensating for an artifact of higher order diffusion Magnetic Resonance Imaging (MRI).

2. Description of Related Art

The term 'diffusion' is interchangeable with the term 'spreading.' When imaging a diffusion of water molecules in vivo, such as in a brain, use of a MRI scheme is referred to as 'diffusion MRI.' Generally, diffusion refers to an isotropic diffusion in which molecules move randomly without a predetermined orientation, as if a drop of color ink spreads on a tissue. However, in a space filled with nerve bundles, such as a brain tissue, diffusion may occur based on a structure of the nerve bundles. Additionally, water molecules may be diffused in spite of being restricted in a part of tissues having an abnormality, such as a lesion.

A Diffusion-Weighted Imaging (DWI) pulse sequence has been developed to be applied to a diagnosis using a structural characteristic of the brain tissue and a diffusion of water molecules in the brain tissue.

A large number of spins exist in a single volume pixel (voxel). When a strong magnetic diffusion gradient is applied, a phase of a material that is well diffused (namely, well moved) in the single voxel may be severely shifted. Accordingly, phases of the spins may be dispersed, which may result in a reduction in signal.

Conversely, in a material that is difficult to be diffused, phases of spins may not be shifted in a strong magnetic diffusion gradient, and, accordingly, a signal reduction may be virtually eliminated. The level of the signal reduction may be influenced by a diffusion level of a tissue, and strength of a magnetic diffusion gradient. To maximize a weak signal reduction due to diffusion, a very strong magnetic diffusion gradient needs to be additionally used. As the strength of the magnetic diffusion gradient is increased, an image in which diffusion is emphasized may be obtained.

DWI is currently used in the form of a Magnetic Resonance (MR) image and an Apparent Diffusion Coefficient (ADC) map to diagnose diseases, such as brain tumors, cerebrovascular diseases, and the like. DWI-related technologies are being developed and applied to Diffusion Tensor Imaging (DTI) and a High-Angular-Resolution Diffusion Imaging (HARDI) method. The DTI refers to a method of applying different directions of a diffusion gradient, obtaining a diffusion direction of a voxel from a tensor model, and reconstructing a tissue structure. The HARDI method, an example of which is a q-Space Imaging (QSI) method, may improve a diffusion directional resolution by applying a significantly larger number of directions of a diffusion gradient than in the DTI.

The DTI visualizes a structure of a neuronal fiber bundle of a white matter in a deep brain. The DTI, as a clinical application, may use a diffusion encoding gradient in the range of 6 to 30 directions, or occasionally in 60 directions. However, considering a current level of angular discrimination ability, there is a limitation to discriminate a crossing fiber and a kissing fiber.

Accordingly, recently, to improve a diffusion angular resolution, q-ball imaging, Diffusion Spectrum Imaging (DSI), and the like are being developed. Such HARDI methods use at least hundreds of directions of a diffusion encoding gradient, and, accordingly, have a disadvantage of a long scan time. However, a scan time may be achieved within 1 hour, based on the above functional advantage, such as high angular resolution, protocol optimization, and the like.

For example, a DSI method needs to apply approximately 203 directions of a magnetic diffusion gradient. Accordingly, a very long scan time may be required, and thermal noise may occur due to heat generation using a strong magnetic diffusion gradient beyond a range of 4000 s/mm² to 6000 s/mm². Additionally, since a strong magnetic diffusion gradient is applied based on various angles within a short time, an eddy current artifact may be generated.

Additionally, a region to be scanned may move due to, for example, breathing or a heart beating. For example, during imaging of a head, any motion may have a very pronounced influence on diffusion tracking.

FIG. 1 illustrates a DSI-203 scan protocol 100 showing an analyzed motion pattern of an image that is actually obtained by DSI. FIG. 2 illustrates a shift pattern 200 of raw timecourse data in association with the DSI-203 scan protocol 100 of FIG. 1.

In scanning using the DSI of the related art, Diffusion-Weighted images need to be acquired in different directions, namely, in approximately 203 orientations. Accordingly, a scan time may be lengthened. Typically, a scan time of about 1 to 2 hours may be required.

Additionally, in the scanning using the DSI of the related art, an image quality may be reduced, and an image may be shifted, due to use of a strong diffusion gradient field.

Furthermore, in the scanning using the DSI of the related art, an image drift motion may occur due to an increase in temperature caused by scanning for a long period, and an image fluctuation motion may occur due to the strong magnetic diffusion gradient.

SUMMARY

In one general aspect, there is provided an apparatus for compensating for an artifact of a higher order diffusion Magnetic Resonance Imaging (MRI), the apparatus including a construction unit configured to construct a diffusion q-space matrix, a correction unit configured to correct an image shift in a phase encoding direction in the constructed diffusion q-space matrix, a reconstruction processing unit configured to reconstruct a q-space obtained from a Diffusion Spectrum Imaging (DSI) based on the corrected image shift, and a tracking processing unit to process a DSI fiber tracking using the reconstructed q-space of the DSI.

The general aspect of the apparatus may further provide that the correction unit is further configured to insert a non-diffusion component into a b-matrix associated with the diffusion q-space matrix, and process computation and registration of a motion using a non-diffusion image into which the non-diffusion component is inserted.

The general aspect of the apparatus may further provide that the correction unit is further configured to calculate a motion matrix of a target from the non-diffusion image, and update the b-matrix.

The general aspect of the apparatus may further provide that the correction unit is further configured to insert the non-diffusion component into the b-matrix during diffusion encoding scanning.

The general aspect of the apparatus may further provide that the correction unit is further configured to correct the b-matrix based on the motion computed by the processed computation.

The general aspect of the apparatus may further provide that the correction unit is further configured to apply, to the b-matrix, a transformation corresponding to the motion computed by the processed computation to correct the b-matrix.

The general aspect of the apparatus may further provide that the correction unit is further configured to correct the image shift in the phase encoding direction, based on a phase encoding element of an updated diffusion vector and a corresponding diffusion gradient size, according to the motion computed by the processed computation.

The general aspect of the apparatus may further provide that the correction unit is further configured to correct the image shift in the phase encoding direction based on the corrected b-matrix.

The general aspect of the apparatus may further provide that the correction unit is further configured to correct the image shift in the phase encoding direction based on a diffusion intensity applied in the b-matrix, and an element of a phase encoding direction of an updated motion matrix.

In another general aspect, there is provided a method of compensating for an artifact of a higher order diffusion Magnetic Resonance Imaging (MRI), the method including constructing a diffusion q-space matrix, correcting an image shift in a phase encoding direction in the constructed diffusion q-space matrix, reconstructing a q-space obtained from a Diffusion Spectrum Imaging (DSI) based on the corrected image shift, and processing a DSI fiber tracking using the reconstructed q-space of the DSI.

The general aspect of the method may further provide that the correcting of the image shift includes inserting a non-diffusion component into a b-matrix during diffusion encoding scanning.

The general aspect of the method may further provide that the correcting of the image shift further includes correcting the b-matrix based on a motion computed by a computation of the motion.

The general aspect of the method may further provide that the correcting of the b-matrix includes applying, to the b-matrix, a transformation corresponding to the motion computed by the computation of the motion.

The general aspect of the method may further provide that the correcting of the image shift is based on a phase encoding element of an updated diffusion vector and a corresponding diffusion gradient size, according to the motion computed by the computation of the motion.

The general aspect of the method may further provide that the correcting of the image shift is based on the corrected b-matrix.

The general aspect of the method may further provide that the correcting of the image shift is based on a diffusion intensity applied in the b-matrix, and an element of a phase encoding direction of an updated motion matrix.

The general aspect of the method may further provide that the correcting of the image shift includes inserting a non-diffusion component into a b-matrix associated with the diffusion q-space matrix, and processing computation and registration of a motion using a non-diffusion image into which the non-diffusion component is inserted.

The general aspect of the method may further provide that the correcting of the image shift further includes calculating a motion matrix of a target from the non-diffusion image, and updating the b-matrix.

In yet another general aspect, there is provided an apparatus to compensate for an artifact of a higher order diffusion Magnetic Resonance Imaging (MRI), the apparatus including a construction unit configured to construct a diffusion q-space matrix, a correction unit configured to insert a non-diffusion component into a b-matrix with the constructed diffusion q-space matrix, process a computation and registration of a motion using a non-diffusion image into which the non-diffusion component is inserted, if rotation is detected, calculate a motion matrix of a target from the non-diffusion image, and update the b-matrix, and correct an image shift in a phase encoding direction in the constructed diffusion q-space matrix, a reconstruction unit configured to reconstruct q-space obtained from a Diffusion Spectrum Imaging (DSI) based on the corrected image shift, and a tracking processing unit configured to process a DSI fiber tracking using the reconstructed q-space of the DSI.

In still another general aspect, there is provided a non-transitory computer readable recording medium storing a program to cause a computer to implement the above-referenced method of compensating for an artifact of a higher order diffusion Magnetic Resonance Imaging (MRI).

Other features and aspects will be apparent from the following detailed description, the drawings, and the claims.

BRIEF DESCRIPTION OF THE DRAWINGS

FIG. 1 is a diagram illustrating an example of a Diffusion Spectrum Imaging (DSI)-203 scan protocol showing an analyzed motion pattern of an image that is actually obtained by DSI.

FIG. 4 is a diagram illustrating an example of a modified scan protocol generated by an apparatus for compensating for an artifact of higher order diffusion MRI.

Figure 2:
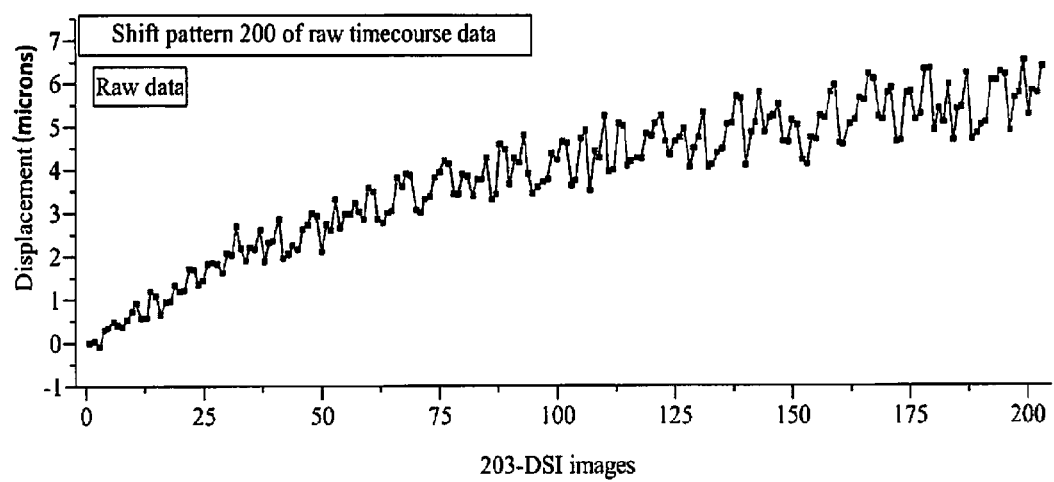
FIG. 2 is a diagram illustrating an example of a shift pattern of raw timecourse data in association with the DSI-203 scan protocol of FIG. 1.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. In addition, description of well-known functions and constructions may be omitted for increased clarity and conciseness.

Figure 3:
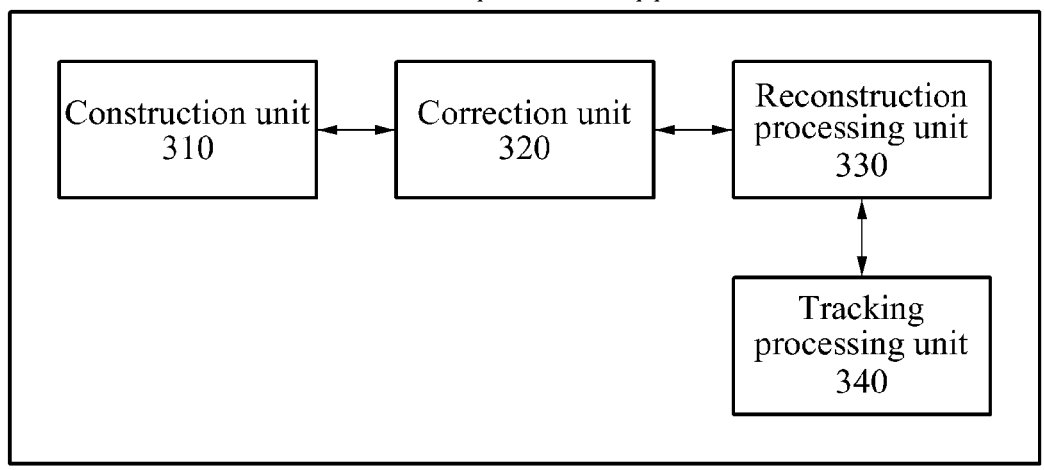
FIG. 3 is a block diagram illustrating an example of an apparatus for compensating for an artifact of higher order diffusion Magnetic Resonance Imaging (MRI).

FIG. 3 illustrates an example of an apparatus 300 for compensating for an artifact of higher order diffusion Magnetic Resonance Imaging (MRI) (hereinafter referred to as "an MRI artifact compensation apparatus"). An MRI artifact compensation apparatus 300 of FIG. 3 may be applied to a motion correction system in an MRI protocol that uses a strong diffusion encoding gradient or performs Diffusion-Weighted Imaging (DWI) for a long period.

For example, the apparatus 300 includes a construction unit 310, a correction unit 320, a reconstruction processing unit 330, and a tracking processing unit 340. The construction unit 310 may construct a diffusion q-space matrix.

The correction unit 320 may correct an image shift in a phase encoding direction in the constructed diffusion q-space matrix, and, thus, may compensate for an artifact due to a fluctuation phenomenon. An example of such a fluctuation phenomenon is an image shift in the phase encoding direction caused by a diffusion encoding gradient. The correction unit 320 may insert a non-diffusion component into a b-matrix associated with the diffusion q-space matrix, and may process computation and registration of a motion using a non-diffusion image into which the non-diffusion component is inserted.

For example, when a large number of diffusion-weighted images is being obtained, the correction unit 320 may insert a T2-weighted image, in which a b-value is 0, to properly detect a motion occurring for a long scan time during in which scanning is performed using a diffusion encoding scheme (non-zero b-value images). The insertion of the above-referenced T2-weighted image may provide an imaging protocol that enables correction of the detected motion.

In other words, the correction unit 320 may calculate a motion matrix of a target from the non-diffusion image, and may subsequently update the b-matrix. For example, the correction unit 320 may insert the non-diffusion component into the b-matrix during diffusion encoding scanning. The correction unit 320 may then correct the b-matrix based on the motion computed by the correction unit 320. For example, the correction unit 320 may apply, to the b-matrix, a transformation corresponding to the computed motion, and may thereby correct the b-matrix.

The correction unit 320 may then correct the image shift in the phase encoding direction based on a phase encoding element of an updated diffusion vector and a corresponding diffusion gradient size, according to the computed motion. Additionally, the correction unit 320 may correct the image shift in the phase encoding direction based on the corrected b-matrix. Furthermore, the correction unit 320 may correct the image shift in the phase encoding direction based on a diffusion intensity applied in the b-matrix and an element of a phase encoding direction of an updated motion matrix.

The reconstruction processing unit 330 may reconstruct a q-space of DSI based on the corrected image shift. The tracking processing unit 340 may process DSI fiber tracking using the reconstructed q-space.

FIG. 4 illustrates an example of a modified scan protocol 400 generated by an MRI artifact compensation apparatus. When a large number of diffusion-weighted images are being obtained, a T2-weighted image in which a b-value is 0 is inserted. As indicated by reference numeral 410 of FIG. 4, a b-value of 0 is inserted in a scan protocol 400 of FIG. 4. In other words, the scan protocol 400 of FIG. 4 may be generated by modifying the DSI-203 scan protocol 100 of FIG. 1.

Figure 5:
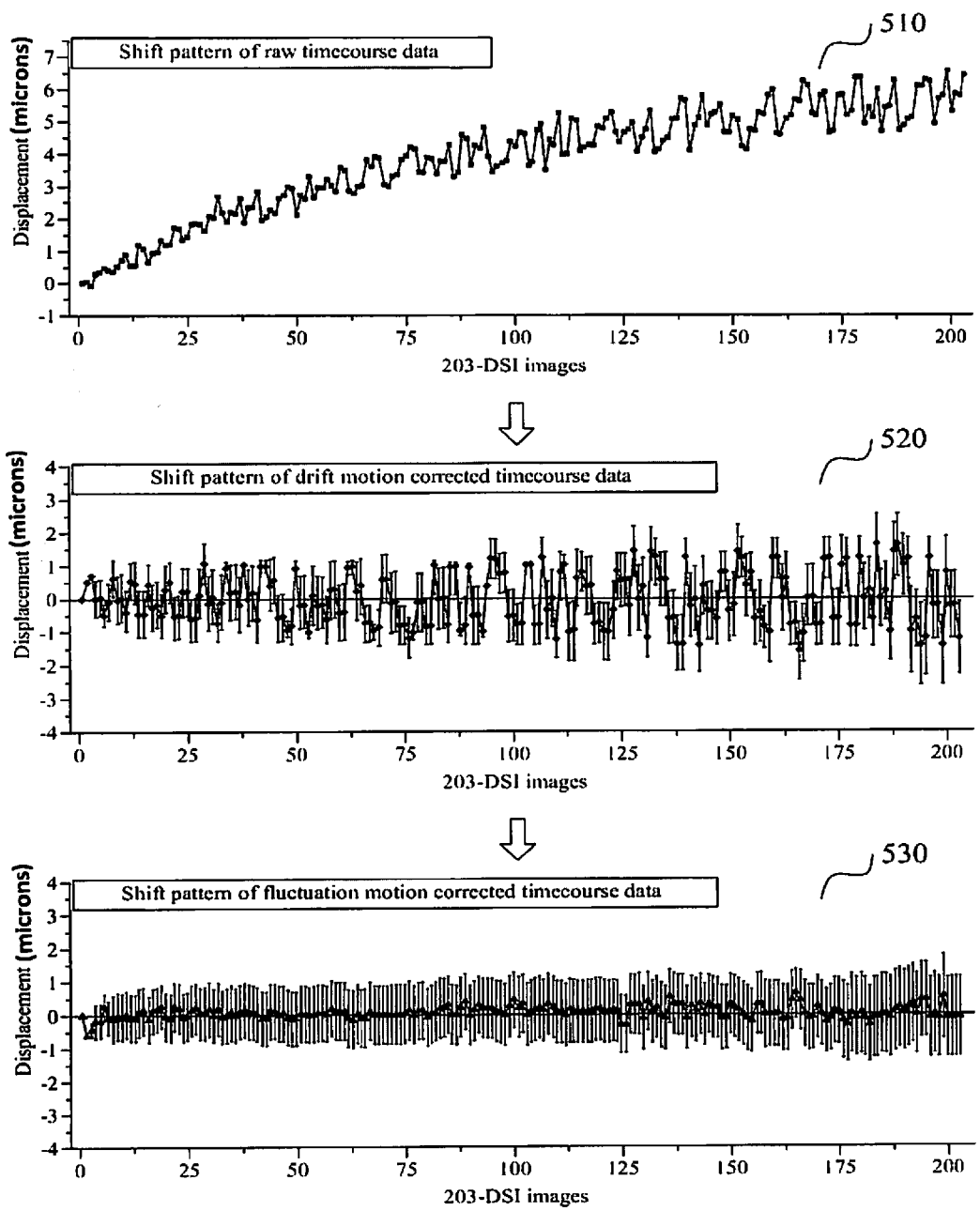
FIG. 5 is a diagram illustrating examples of shift patterns corrected by the scan protocol of FIG. 4.

FIG. 5 illustrates examples of shift patterns 510, 520, 530 corrected by the scan protocol 400 of FIG. 4. By inserting the T2-weighted image as shown in FIG. 4, a shift pattern 510 is corrected to be a shift pattern 530 through a shift pattern 520.

In the shift pattern 510 of raw timecourse data, an image quality may be reduced and an image may be shifted due to use of a strong diffusion gradient field, which is similar to that of the related art. During imaging with a high b-value, an image-based motion correction may be impossible due to a reduction in the image quality.

In the shift pattern 520, a b-matrix may be corrected corresponding to a number of detected rotations by inserting a non-diffusion component into an existing b-matrix and processing computation and registration of a motion using a non-diffusion image, into which the non-diffusion component is inserted.

The shift pattern 530 is generated by correcting an image shift in a phase encoding direction in the shift pattern 520. Since a very large number of directions of a diffusion encoding gradient needs to be applied to an image using a DSI of the related art, a long scan time may be required. Additionally, eddy current may occur by a switching of the diffusion encoding gradient. Accordingly, the image may be distorted. The distorted image may be corrected using a shift pattern, as described above with reference to FIG. 5.

Figure 6:
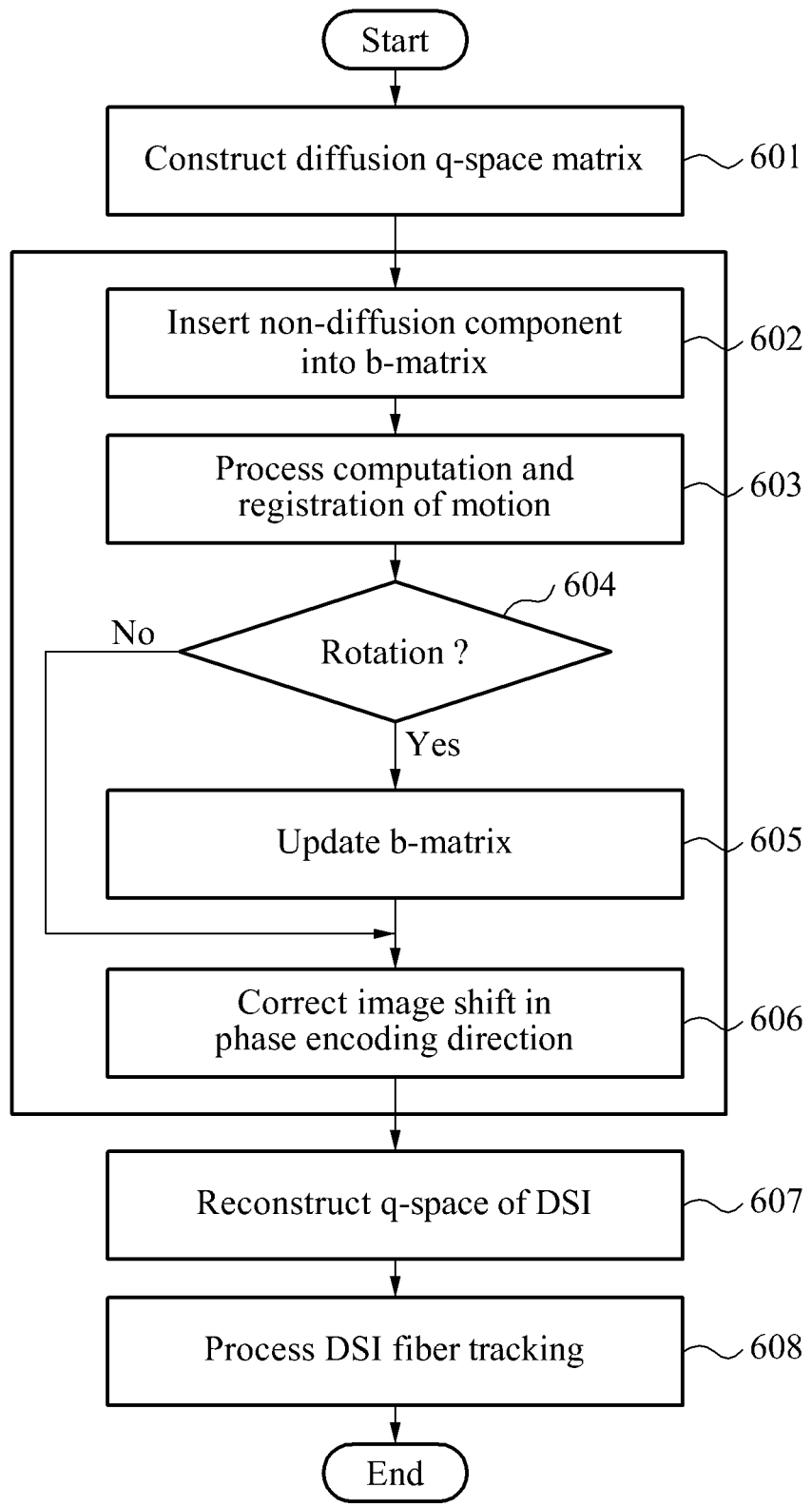
FIG. 6 is a flowchart illustrating an example of a method of compensating for an artifact of higher order diffusion MRI.

FIG. 6 illustrates an example of a method of compensating for an artifact of a higher order diffusion MRI. The method of FIG. 6 may be applied to a motion correction system in an MRI protocol that uses a strong diffusion encoding gradient or performs DWI for a long period.

In 601, a diffusion q-space matrix is constructed. Subsequently, an image shift in a phase encoding direction is corrected in the constructed diffusion q-space matrix. For example, in 602, a non-diffusion component is inserted into a b-matrix associated with the diffusion q-space matrix during diffusion encoding scanning. In 603, computation and registration of a motion is processed using a non-diffusion image into which the non-diffusion component is inserted. The b-matrix may be corrected based on the motion corrected by the correction of the motion. For example, the b-matrix may be corrected by applying, to the b-matrix, a transformation corresponding to the computed motion.

In 604, a determination is made as to whether rotation exists. When the rotation is detected, a motion matrix of a target may be calculated from the non-diffusion image, and the b-matrix is updated in 605. By updating the b-matrix, the b-matrix may be corrected corresponding to a number of motions. When the rotation is not detected, the image shift in the phase encoding direction is corrected in 606. For example, the image shift in the phase encoding direction may be corrected based on the corrected b-matrix. In other words, the image shift in the phase encoding direction may be corrected based on a diffusion intensity applied in the b-matrix, and an element of a phase encoding direction of an updated motion matrix.

In 607, a q-space of a DSI is reconstructed based on the corrected image shift. In 608, DSI fiber tracking is processed using the reconstructed q-space.

According to the teachings above, there is provided an apparatus for compensating for an artifact of a higher order diffusion MRI that may make it possible to properly detect a motion occurring for a long scan time, during which scanning is performed using a diffusion encoding scheme (non-zero b-value images), and provide an imaging protocol that enables correction of the detected motion.

Further, according to the teachings above, there is provided an MRI artifact compensation apparatus that may make it possible to reduce a fluctuation phenomenon in a phase encoding gradient direction, that is, an effect of a motion by an applied diffusion gradient as well as an actual motion of an object for a long scan time.

In addition, according to the teachings above, there is provided an MRI artifact compensation apparatus that may make it possible to acquire higher order diffusion MRI data in which a motion and a diffusion gradient artifact are corrected, thereby making it possible to perform a diffusion tractography that increases a tracking performance by extracting more accurate diffusion information.

Moreover, according to the teachings above, there is provided an MRI artifact compensation apparatus that may make it possible to increase accuracy of brain connectivity by combining Blood Oxygen Level Dependent (BOLD) functional MRI (fMRI) with resting-state fMRI based on a tracking result.

Additionally, according to the teachings above, there is provided a method of compensating for an artifact of a higher order diffusion MRI, in which a T2-weighted image having a b-value of 0 is inserted when a large number of diffusion-weighted images are being obtained, that may make it possible to properly detect a motion occurring for a long scan time during which a diffusion-encoded non-zero b-value image is scanned and provide an imaging protocol that enables correction of the detected motion.

Furthermore, according to the teachings above, there is provided a method of compensating for an artifact of a higher order diffusion MRI that may make it possible to compensate for an artifact due to a fluctuation phenomenon, namely, an image shift in a phase encoding direction caused by a diffusion encoding gradient.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. In addition, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. In addition, the described apparatus or units to perform an operation or a method may be hardware, software, or some combination of hardware and software. For example, the apparatus or units may be a software package running on a computer or the computer on which that software is running. A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for compensating for an artifact generated by a diffusion Magnetic Resonance Imaging (MRI) technique, the apparatus comprising:
   a construction unit configured to construct a diffusion q-space matrix;
   a correction unit configured to correct an image shift in a phase encoding direction in the constructed diffusion q-space matrix;
   a reconstruction processing unit configured to reconstruct a q-space of a Diffusion Spectrum Imaging (DSI) technique based on the corrected image shift; and
   a tracking processing unit to process a DSI fiber tracking using the reconstructed q-space of the DSI.

2. The apparatus of claim 1, wherein the correction unit is further configured to:
   insert a non-diffusion component into a b-matrix associated with the diffusion q-space matrix; and
   process a computation and a registration of a motion using a non-diffusion image into which the non-diffusion component is inserted.

3. The apparatus of claim 2, wherein the correction unit is further configured to:
   calculate a motion matrix of a target from the non-diffusion image; and
   update the b-matrix.

4. The apparatus of claim 2, wherein the correction unit is further configured to insert the non-diffusion component into the b-matrix during diffusion encoding scanning.

5. The apparatus of claim 2, wherein the correction unit is further configured to correct the b-matrix based on the motion computed by the processed computation.

6. The apparatus of claim 5, wherein the correction unit is further configured to apply, to the b-matrix, a transformation corresponding to the motion computed by the processed computation to correct the b-matrix.

7. The apparatus of claim 5, wherein the correction unit is further configured to correct the image shift in the phase encoding direction, based on a phase encoding element of a diffusion vector and a corresponding diffusion gradient size, according to the motion computed by the processed computation.

8. The apparatus of claim 5, wherein the correction unit is further configured to correct the image shift in the phase encoding direction based on the corrected b-matrix.

9. The apparatus of claim 8, wherein the correction unit is further configured to correct the image shift in the phase encoding direction based on:
   a diffusion intensity applied in the b-matrix; and
   an element of a phase encoding direction of an updated motion matrix.

10. A method of compensating for an artifact of a diffusion Magnetic Resonance Imaging (MRI) technique, the method comprising:
    constructing a diffusion q-space matrix;
    correcting an image shift in a phase encoding direction in the constructed diffusion q-space matrix;

reconstructing a q-space obtained from a Diffusion Spectrum Imaging (DSI) technique based on the corrected image shift; and processing a DSI fiber tracking using the reconstructed q-space of the DSI.

11. The method of claim 10, wherein the correcting of the image shift comprises inserting a non-diffusion component into a b-matrix during diffusion encoding scanning.

12. The method of claim 11, wherein the correcting of the image shift further comprises correcting the b-matrix based on a computed motion.

13. The method of claim 12, wherein the correcting of the b-matrix comprises applying, to the b-matrix, a transformation corresponding to the computed motion.

14. The method of claim 12, wherein the correcting of the image shift is based on a phase encoding element of a diffusion vector and a corresponding diffusion gradient size, according to the motion computed by the computation of the motion.

15. The method of claim 12, wherein the correcting of the image shift is based on the corrected b-matrix.

16. The method of claim 15, wherein the correcting of the image shift is based on:
a diffusion intensity applied in the b-matrix; and
an element of a phase encoding direction of an updated motion matrix.

17. The method of claim 10, wherein the correcting of the image shift comprises:
inserting a non-diffusion component into a b-matrix associated with the diffusion q-space matrix; and
processing a computation and a registration of a motion using a non-diffusion image into which the non-diffusion component is inserted.

18. The method of claim 17, wherein the correcting of the image shift further comprises:
calculating a motion matrix of a target from the non-diffusion image; and
updating the b-matrix.

19. An apparatus to compensate for an artifact generated by a diffusion Magnetic Resonance Imaging (MRI) technique, the apparatus comprising:
a construction unit configured to construct a diffusion q-space matrix;
a correction unit configured to:
insert a non-diffusion component into a b-matrix with the constructed diffusion q-space matrix;
process a computation and registration of a motion using a non-diffusion image into which the non-diffusion component is inserted;
if rotation is detected:
calculate a motion matrix of a target from the non-diffusion image; and
update the b-matrix; and
correct an image shift in a phase encoding direction in the constructed diffusion q-space matrix;
a reconstruction unit configured to reconstruct q-space obtained from a Diffusion Spectrum Imaging (DSI) technique based on the corrected image shift; and
a tracking processing unit configured to process a DSI fiber tracking using the reconstructed q-space of the DSI.

20. A non-transitory computer readable recording medium storing a program to cause a computer to implement the method of claim 10.

* * * * *